(12) United States Patent
Koshihara

(10) Patent No.: US 11,199,718 B2
(45) Date of Patent: Dec. 14, 2021

(54) IMAGE DISPLAY MODULE AND IMAGE DISPLAY DEVICE

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 134 days.

(21) Appl. No.: 16/574,457

(22) Filed: Sep. 18, 2019

(65) Prior Publication Data

US 2020/0089012 A1 Mar. 19, 2020

(30) Foreign Application Priority Data

Sep. 19, 2018 (JP) .............................. JP2018-174621

(51) Int. Cl.
*G02B 27/12* (2006.01)
*G02B 27/01* (2006.01)
*G02B 27/10* (2006.01)

(52) U.S. Cl.
CPC ....... *G02B 27/126* (2013.01); *G02B 27/0172* (2013.01); *G02B 27/102* (2013.01); *G02B 2027/0178* (2013.01)

(58) Field of Classification Search
CPC .. G03B 21/005; G03B 21/006; G03B 21/008; G03B 21/28; G03B 21/206; G03B 21/2013; G03B 21/2033; G03B 21/2053; H04N 9/315; H04N 9/3102; H04N 9/3111; H04N 9/3161; G02B 2027/0178; G02B 2027/0172; G02B 2027/0118; G02B 2027/0112; G02B 27/10; G02B 27/102;
(Continued)

(56) References Cited

U.S. PATENT DOCUMENTS

2002/0196413 A1* 12/2002 Kwok ................. H04N 9/3105 353/20
2004/0021833 A1 2/2004 Koide
(Continued)

FOREIGN PATENT DOCUMENTS

JP S62-143087 A 6/1987
JP 2004-062108 A 2/2004
(Continued)

*Primary Examiner* — Sultan Chowdhury
(74) *Attorney, Agent, or Firm* — Oliff PLC

(57) ABSTRACT

An image display module according to the present disclosure includes a first display panel including a plurality of first pixels each including a first light-emitting element, the first display panel being configured to emit first colored light of a first wavelength region, a second display panel including a plurality of second pixels each including a second light-emitting element and a plurality of third pixels each including a third light-emitting element, the second display panel being configured to emit second colored light of a second wavelength region, and emit third colored light of a third wavelength region, and a synthesis optical system including a dichroic prism which including a dichroic mirror and being configured to synthesize the first, the second, and the third colored light, the dichroic mirror being configured to transmit or reflect the first colored light and reflect or transmit the second and the third colored light.

12 Claims, 9 Drawing Sheets

(58) Field of Classification Search
CPC .. G02B 27/126; G02B 27/141; G02B 27/017; G02B 27/0101; G02B 27/0172
See application file for complete search history.

(56) References Cited

U.S. PATENT DOCUMENTS

| | | | |
|---|---|---|---|
| 2005/0146652 A1* | 7/2005 | Yokoyama | G02B 27/1053 349/61 |
| 2010/0157433 A1* | 6/2010 | Mukawa | G02B 27/0172 359/633 |
| 2013/0128611 A1* | 5/2013 | Akutsu | G03H 1/0248 362/607 |
| 2013/0285537 A1 | 10/2013 | Chaji | |
| 2017/0280094 A1* | 9/2017 | Ito | H04N 9/3164 |
| 2018/0137797 A1* | 5/2018 | Ohara | G09G 3/2003 |

FOREIGN PATENT DOCUMENTS

| | | |
|---|---|---|
| JP | 2005-189472 A | 7/2005 |
| JP | 2012-230151 A | 11/2012 |
| JP | 2015-515732 A | 5/2015 |

* cited by examiner

IMAGE DISPLAY MODULE AND IMAGE DISPLAY DEVICE

The present application is based on, and claims priority from JP Application Serial Number 2018-174621, filed Sep. 19, 2018, the disclosure of which is hereby incorporated by reference herein in its entirety.

BACKGROUND

1. Technical Field

The present disclosure relates to an image display module and an image display device.

2. Related Art

Image display modules including three display panels each emitting light of a particular color and a color synthesis prism that synthesizes the colored light emitted from the display panels have been known as a component for image display devices such as a head-mounted display and a projector.

JP-A-2012-230151 discloses an electro-optical device including a first display unit including organic electroluminescence (EL) elements configured to emit blue light, a second display unit including organic EL elements configured to emit green light, a third display unit including organic EL elements configured to emit red light, and a cross dichroic prism configured to synthesize the light from the three display units.

In the electro-optical device disclosed in JP-A-2012-230151, the cross dichroic prism includes two dichroic mirrors intersecting each other. The intersection of the two dichroic mirrors causes a linear defect at a center of an image. Therefore, the electro-optical device disclosed in JP-A-2012-230151 has a problem of insufficient image quality due to the linear defect.

SUMMARY

To solve the above-described problem, an image display module according to an aspect of the present disclosure includes a first display panel including a plurality of first pixels each including a first light-emitting element, the first display panel being configured to emit, from each of the plurality of first pixels, first colored light of a first wavelength region, a second display panel including a plurality of second pixels each including a second light-emitting element and a plurality of third pixels each including a third light-emitting element, the second display panel being configured to emit, from each of the plurality of second pixels, second colored light of a second wavelength region, which is different from the first wavelength region, and emit, from each of the plurality of third pixels, third colored light of a third wavelength region, which is different from the first wavelength region and the second wavelength region, and a synthesis optical system including a dichroic prism, the dichroic prism including a dichroic mirror and being configured to synthesize the first colored light, the second colored light, and the third colored light, the dichroic mirror being configured to transmit or reflect the first colored light and reflect or transmit the second colored light and the third colored light.

In the image display module according to the aspect of the present disclosure, the first colored light may be green light, the second colored light may be blue light, and the third colored light may be red light.

In the second display panel, an area of the second pixel may be larger than an area of the third pixel.

In the image display module according to the aspect of the present disclosure, dimensions of the plurality of first pixels, the plurality of second pixels, and the plurality of third pixels may be identical to one another, and each of the plurality of second pixels and each of the plurality of third pixels may be alternately arranged in a horizontal direction and a vertical direction of the second display panel.

In a synthesized image including the first colored light, the second colored light, and the third colored light, positions of images by the plurality of first pixels may be shifted from positions of images by the plurality of second pixels and the plurality of third pixels.

In the image display module according to the aspect of the present disclosure, the positions of images by the plurality of first pixels may be shifted from the positions of images by the plurality of second pixels and the plurality of third pixels, in a horizontal direction of the synthesized image.

In the image display module according to the aspect of the present disclosure, the positions of images by the plurality of first pixels may be shifted from the positions of images by the plurality of second pixels and the plurality of third pixels, in a vertical direction of the synthesized image.

In the image display module according to the aspect of the present disclosure, the positions of images by the plurality of first pixels may be shifted from the positions of images by the plurality of second pixels and the plurality of third pixels, in an oblique direction of the synthesized image.

An image display module according to an aspect of the present disclosure includes a first display panel configured to emit first colored light of a first wavelength region, a second display panel configured to emit second colored light of a second wavelength region, which is different from the first wavelength region, and third colored light of a third wavelength region, which is different from the first wavelength region and the second wavelength region, and a synthesis optical system including a dichroic prism, the dichroic prism including a dichroic mirror and being configured to synthesize the first colored light, the second colored light, and the third colored light, the dichroic mirror being configured to transmit or reflect the first colored light and reflect or transmit the second colored light and the third colored light. In the image display module, the first display panel includes a plurality of first light-emitting elements configured to emit the first colored light, and the second display panel includes a plurality of second light-emitting elements configured to emit the second colored light and a plurality of third light-emitting elements configured to emit the third colored light.

An image display device according to an aspect of the present disclosure includes an image display module according to an aspect of the present disclosure.

DESCRIPTION OF EXEMPLARY EMBODIMENTS

First Embodiment

A first embodiment of the present disclosure will be described below with reference to FIGS. 1 to 8.

Figure 1:
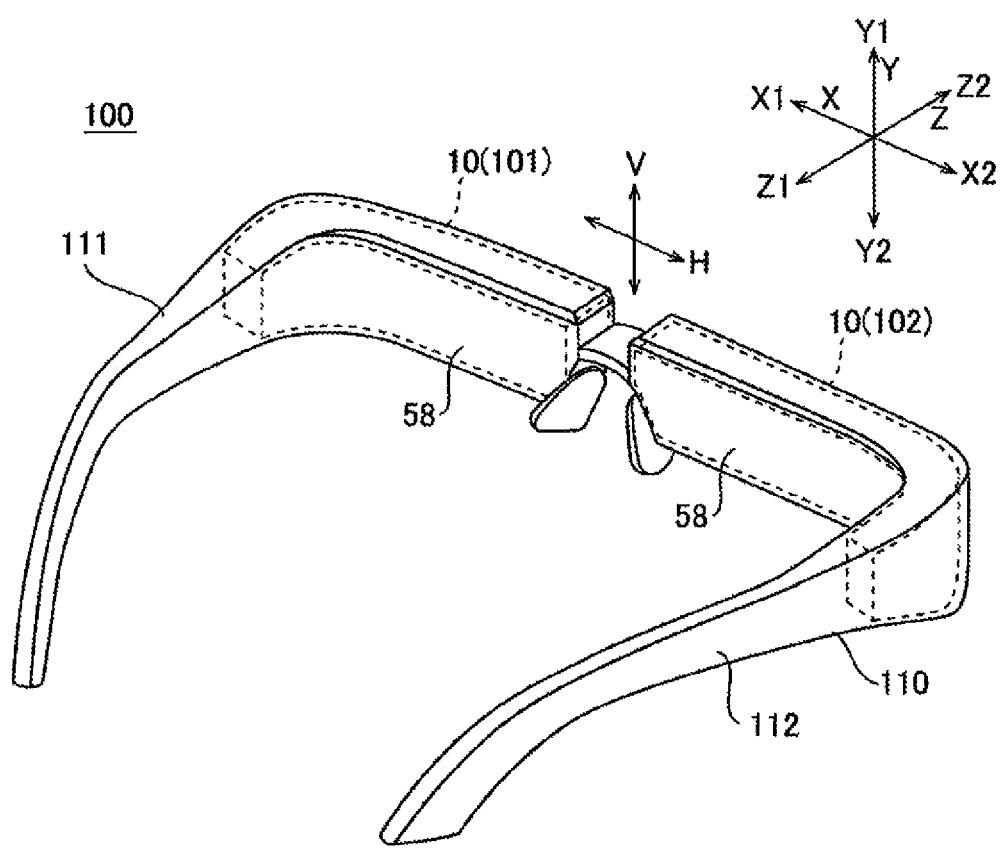
FIG. 1 is a perspective view illustrating a schematic configuration of an image display device according to First Embodiment.

FIG. 1 is a perspective view illustrating a schematic configuration of an image display device according to First Embodiment.

Note that, in the drawings, the dimensions of some components may be scaled differently for ease of understanding for the components.

As illustrated in FIG. 1, an image display device 100 according to First Embodiment is configured as a head-mounted image display apparatus such as a see-through type eyeglass display, and includes a frame 110 provided with left and right temples 111 and 112. In the image display device 100, a display unit 10 described below is supported by the frame 110. The image display device 100 allows a user to recognize an image emitted by the display unit 10 as a virtual image. In First Embodiment, the image display device 100 includes the display unit 10 including a left-eye display unit 101 and a right-eye display unit 102. The left-eye display unit 101 and the right-eye display unit 102 have the same configuration and are arranged left-right symmetrically.

In the following description, the left-eye display unit 101 will be mainly described, and the description for the right-eye display unit 102 will be omitted. Note that, in the following description, the left-right direction for the user is defined as the first direction X, the front-rear direction for the user is defined as the second direction Z, and the up-down direction for the user is defined as the third direction Y. Further, one side (left side) in the first direction X is represented by X1, the other side (right side) in the first direction X is represented by X2, one side (rear side) in the second direction Z is represented by Z1, the other side (front side) in the second direction Z is represented by Z2, one side (upper side) in the third direction Y is represented by Y1, and the other side (lower side) in the third direction Y is represented by Y2. Here, the left-eye display unit 101 and the right-eye display unit 102 are symmetrically arranged, and thus, in the display unit 102, the relationship between the one side X1 and the other side X2 in the first direction X is horizontally reversed in comparison to that in the display unit 101.

Overall Configuration of Display Unit

Figure 2:
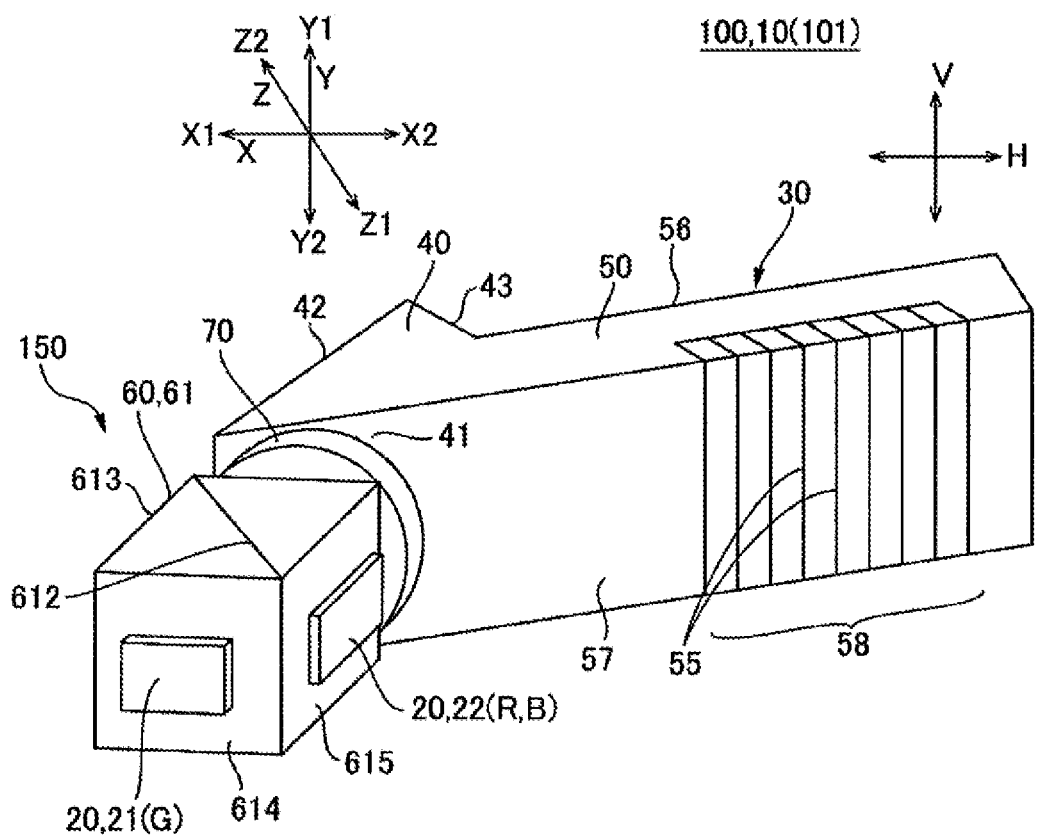
FIG. 2 is a perspective view illustrating an optical system of a display unit in the image display device.
Figure 3:
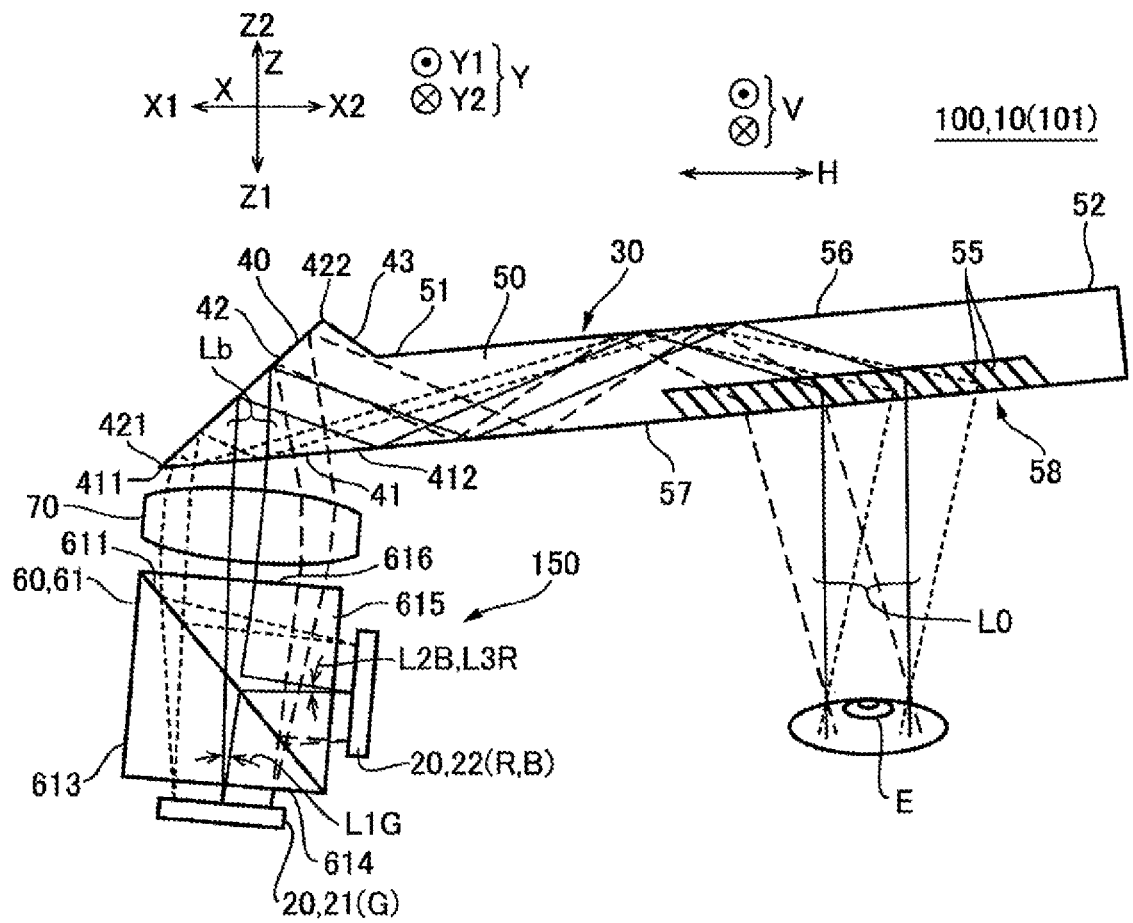
FIG. 3 is a plan view of the display unit as viewed from a third direction.

FIG. 2 is a perspective view schematically illustrating a configuration of an optical system of the display unit 10 illustrated in FIG. 1. FIG. 3 is a plan view of the display unit 10 illustrated in FIG. 2 as viewed from the third direction Y. Note that, in FIGS. 2 and 3, portions corresponding to red light, green light, and blue light are denoted by (R), (G), and (B), respectively. In addition, among rays of the colored light L emitted from each display panel 20, only an effective light flux of the colored light L that enters the eye E of an observer as image light L0 is illustrated. Further, as the effective light flux, the effective luminous flux emitted from the pixels at the center of the display panel 20 is represented by solid lines, the effective luminous flux emitted from the pixels at one edge of the display panel 20 is represented by long dashed lines, and the effective luminous flux emitted from the pixels at the other edge of the display panel 20 is represented by short dashed lines.

As illustrated in FIGS. 2 and 3, the display unit 10 of the image display device 100 (the left-eye display unit 101) includes an image display module 150 configured to emit synthesized light Lb generated by synthesizing a plurality of rays of colored light, and a light-guiding optical system 30 configured to guide the synthesized light Lb emitted from the image display module 150, to an emitting part 58. The image display module 150 includes a plurality of display panels 20 and a synthesis optical system 60 configured to synthesize colored light emitted from the plurality of display panels 20. A projection optical system 70 is provided between the synthesis optical system 60 and the light-guiding optical system 30. The synthesized light Lb emitted from the synthesis optical system 60 enters the light-guiding optical system 30 via the projection optical system 70. The projection optical system 70 is configured by a single collimate lens having a positive power.

The light-guiding optical system 30 includes a transmissive incidence part 40 configured to receive the synthesized light Lb, and a transmissive light-guiding part 50 having one end 51 in the first direction X coupled to the incidence part 40. In the embodiment, the incidence part 40 and the light-guiding part 50 are formed as a single light transmissive member.

The incidence part 40 includes an incident surface 41 for receiving the synthesized light Lb emitted from the synthesis optical system 60, and a reflection surface 42 for reflecting, toward the incident surface 41, the synthesized light Lb that has entered from the incident surface 41. The incident surface 41 is a flat surface, an aspherical surface, a free form surface, or the like, that faces the one side Z1 in the second direction Z, and faces the synthesis optical system 60 with the projection optical system 70 interposed between the incident surface 41 and the synthesis optical system 60. The projection optical system 70 is disposed obliquely such that the interval between the projection optical system 70 and an end 412 on the other side X2 in the first direction X of the incident surface 41 is larger than the interval between the projection optical system 70 and an end 411 on the one side X1 in the first direction of the incident surface 41. The incident surface 41 does not include a reflection film or the like formed thereon. However, the incident surface 41 fully reflects light that is incident at an incident angle equal to or greater than a critical angle. Thus, the incident surface 41 is light-transmissive and light-reflective.

The reflection surface 42 is a surface located on the other side Z2 in the second direction Z with respect to the incident surface 41. The reflection surface 42 includes an end 422 on the other side X2 in the first direction X and an end 421 on the one side X1 in the first direction X, and is obliquely provided so that the end 422 is positioned farther from the incident surface 41 than the end 421. Thus, the incidence part 40 has a substantially triangular shape, as viewed from the third direction Y.

The reflection surface 42 is a flat surface, an aspherical surface, a free form surface, or the like. The reflection surface 42 may not include a reflection film or the like formed thereon, and may be configured to fully reflect light that is incident at an incident angle equal to or greater than a critical angle. Alternatively, the reflection surface 42 may have a configuration in which a reflective metal layer, mainly made of aluminum, silver, magnesium, chrome or the like, is formed.

The light-guiding part 50 includes a first surface 56 (first reflection surface) that extends from the one end 51 (the end on the one side X1) to the other end 52 side in the first direction X (the end on the other side X2), a second surface 57 (second reflection surface) that extends from the one end 51 side to the other end 52 side in the first direction X, and the emitting part 58 provided on a part of the second surface 57 that is apart from the incidence part 40. The second surface 57 is positioned on the one side Z1 in the second direction Z with respect to the first surface 56, and is parallel to the first surface 56 to face the first surface 56.

The first surface 56 and the reflection surface 42 are formed as a continuous surface with an oblique surface 43 interposed between the first surface 56 and the reflection surface 42. The thickness in the second direction Z between the first surface 56 and the second surface 57 (the dimension in the second direction Z of the light-guiding part 50) is less than the dimension in the second direction Z of the incidence part 40. The first surface 56 and the second surface 57 fully reflect light incident on the first surface 56 and the second surface 57 at an incident angle equal to or greater than a critical angle based on a refractive index difference between the light-guiding part 50 and the outside (the air). Thus, the first surface 56 and the second surface 57 do not include a reflection film or the like formed thereon.

The emitting part 58 is formed on a part of the second surface 57 of the light-guiding part 50. In the emitting part 58, a plurality of partial reflection surfaces 55 extending parallel to each other are arranged along the first direction X. Each of the plurality of partial reflection surfaces 55 is angled toward the one side X1 in the first direction X with respect to the normal direction of the second surface 57, as viewed from the third direction Y. The emitting part 58 is a portion of the second surface 57 that overlaps with the plurality of partial reflection surfaces 55 along the first direction X, and is a region having a predetermined width in the first direction X. Each of the plurality of partial reflection surfaces 55 includes a dielectric multilayer film provided in the light transmissive member.

At least one of the plurality of partial reflection surfaces 55 may be a composite film including a dielectric multilayer film and a reflective metal layer (thin film) mainly made of aluminum, silver, magnesium, chrome, or the like. When the partial reflection surface 55 includes a metal layer, it is possible to obtain an effect of enhancing the reflectance of the partial reflection surface 55, or to obtain an effect of optimizing the incident angle dependence or the polarization dependence of the transmittance and the reflectance of the partial reflection surface 55. Note that the emitting part 58 may include an optical element such as a diffraction grating and a hologram.

Configuration of Optical Device

Figure 4:
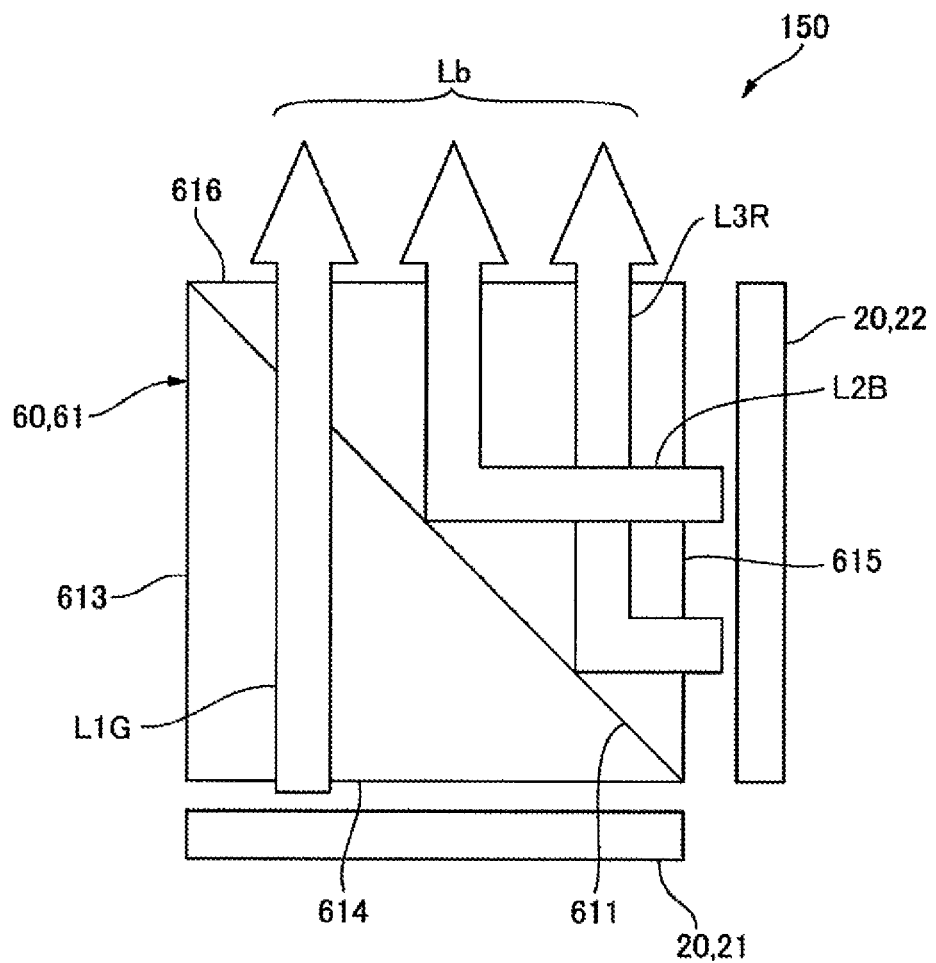
FIG. 4 is a plan view of an image display module as viewed from the third direction.
Figure 5:
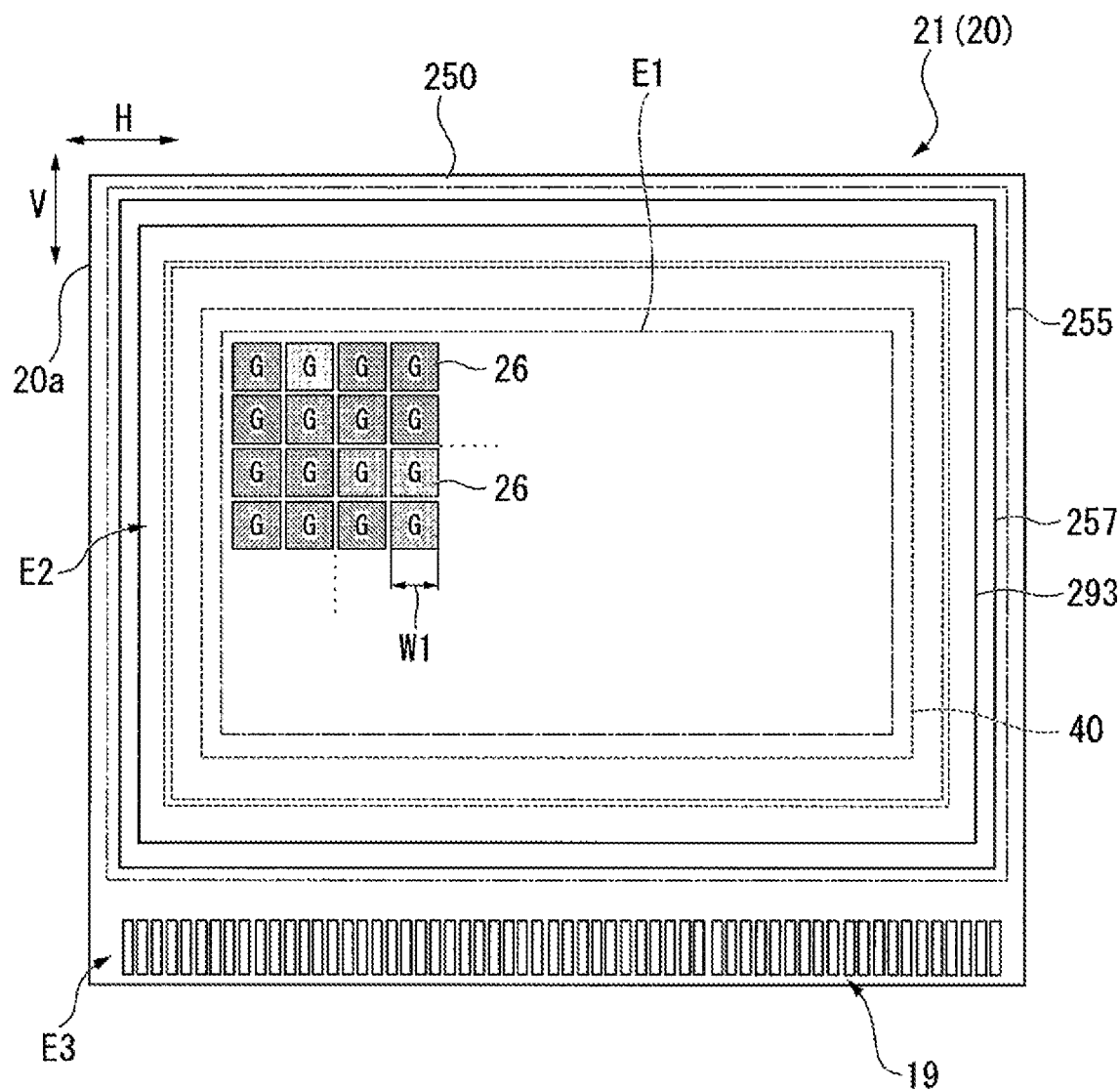
FIG. 5 is a front view of a first display panel.
Figure 6:
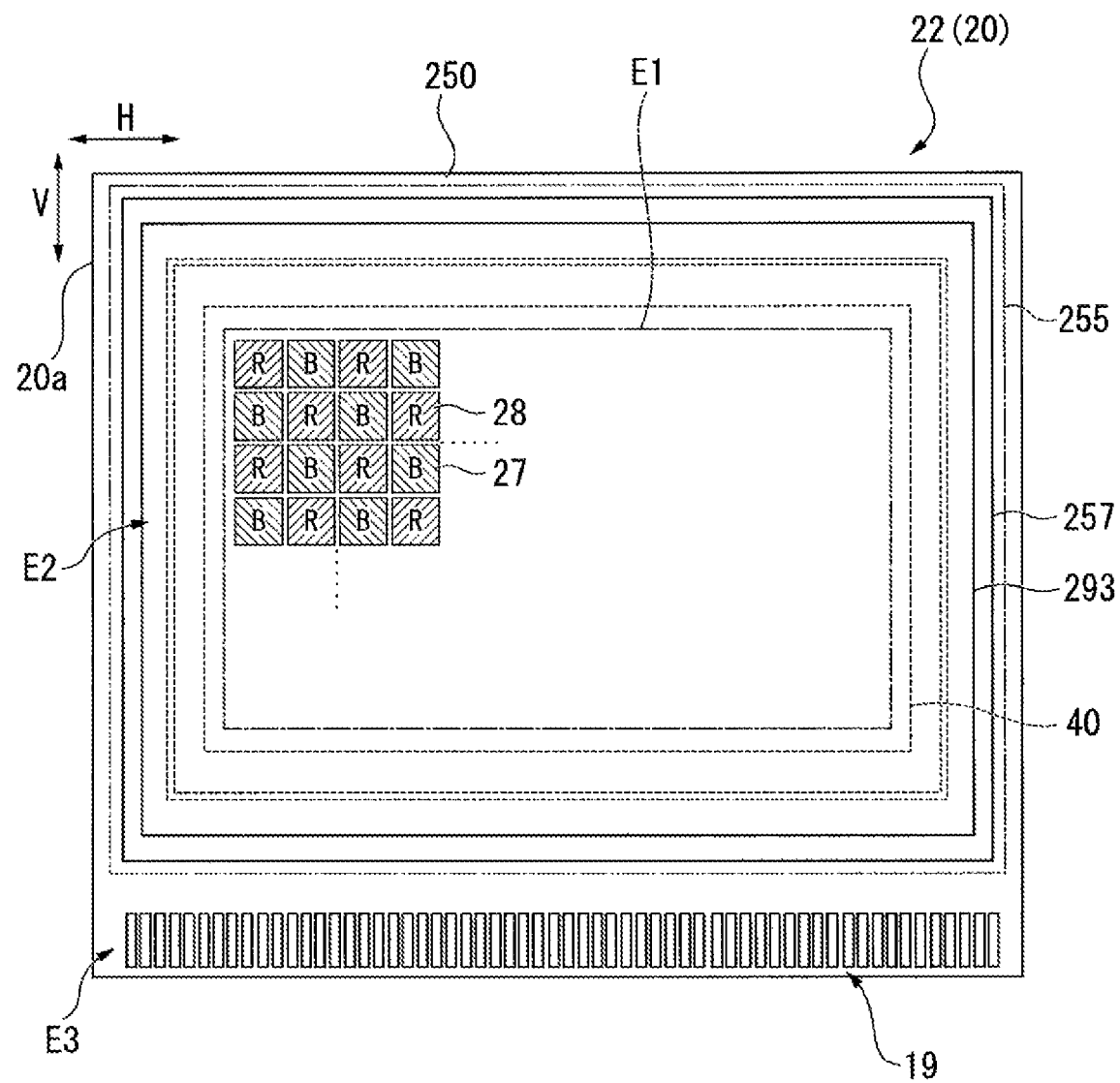
FIG. 6 is a front view of a second display panel.

FIG. 4 is a schematic view of the image display module 150 illustrated in FIGS. 2 and 3 as viewed from the third direction Y. FIG. 5 is a front view of a first display panel. FIG. 6 is a front view of a second display panel.

As illustrated in FIG. 4, the image display module 150 includes two display panels 20, i.e., a first display panel 21 and a second display panel 22, and the synthesis optical system 60.

As illustrated in FIG. 5, the first display panel 21 includes a plurality of first pixels 26 each including a first light-emitting element, and is configured to emit, from each of the plurality of first pixels 26, first colored light L1G having wavelengths in a first wavelength region. As illustrated in FIG. 6, the second display panel 22 includes a plurality of second pixels 27 each including a second light-emitting element, and a plurality of third pixels 28 each including a third light-emitting element. The second display panel 22 is configured to emit, from each of the plurality of second pixels 27, second colored light L2B having wavelengths in a second wavelength region different from the first wavelength region, and emit, from each of the plurality of third pixels 28, third colored light L3R having wavelengths in a third wavelength region different from the first wavelength region and the second wavelength region.

The synthesis optical system 60 includes a dichroic prism 61. The dichroic prism 61 includes a dichroic mirror 611 oriented obliquely with respect to an emission surface of the first display panel 21 and an emission surface of the second display panel 22. The dichroic prism 61 includes an emission surface 616 facing the projection optical system 70, a first incident surface 614 facing the emission surface 616, a second incident surface 615 intersecting the emission surface 616 and the first incident surface 614, and an end face 613 facing the second incident surface 615. When viewed from the third direction Y, the dichroic mirror 611 is formed along a diagonal line connecting the corner which is the intersection of the emission surface 616 and the end surface 613 and the corner which is the intersection of the first incident surface 614 and the second incident surface 615.

The first display panel 21 is disposed so as to face the first incident surface 614, and the second display panel 22 is disposed so as to face the second incident surface 615. The dichroic mirror 611 is configured to transmit the first colored light L1G emitted from the first display panel 21 to emit the first colored light L1G through the emission surface 616, and reflect the second colored light L2B and the third colored light L3R emitted from the second display panel 22 to emit the second colored light L2B and the third colored light L3R through the emission surface 616. As a result, the green light emitted from the first display panel 21 (first colored light L1G) and the blue light and red light emitted from the second display panel 22 (second colored light L2B and third colored light L3R) are synthesized to form the synthesized light Lb, and the synthesized light Lb is emitted from the emission surface 616 toward the projection optical system 70.

Note that the dichroic mirror 611 may have characteristics contrary to the above-described characteristics. In other words, the dichroic mirror 611 may reflect the first colored light L1G emitted from the first display panel 21 and transmit the second colored light L2B and the third colored light L3R emitted from the second display panel 22. The dichroic mirror 611 having this configuration can also provide an ability to synthesize the first colored light L1G, the second colored light L2B, and the third colored light L3R. In this case, the synthesized light Lb is emitted from the end surface 613 of the dichroic prism 61.

In the image display module 150 having the configuration described above, each of the first colored light L1G, the second colored light L2B, and the third colored light L3R corresponds to any one of three primary color light (i.e., red light, green light, and blue light). In the embodiment, the peak wavelength of the first colored light L1G emitted from the first display panel 21 is longer than the peak wavelength of the second colored light L2B emitted from the second display panel 22, and shorter than the peak wavelength of the third colored light L3R. In other words, the first colored light L1G emitted from the first display panel 21 is green light. The second colored light L2B emitted from the second display panel 22 is blue light, and the third colored light L3R emitted from the second display panel 22 is red light.

In the embodiment, the blue light is light having a peak wavelength of, for example, 400 nm to 500 nm in the blue wavelength region of the spectrum, for example. The green light is light having a peak wavelength of, for example, 500 nm to 580 nm, in the green wavelength region of the spectrum, for example. The the red light is light having a peak wavelength of, for example, 580 nm to 780 nm in the red wavelength region of the spectrum, for example.

In the following description, the horizontal direction of the display panels 20 illustrated in FIGS. 5 and 6 is a direction in which scanning lines extend in a light-emitting region E1, and is referred to as a horizontal direction H. On the other hand, the vertical direction of the display panel 20 is a direction in which the data lines extend in the light-emitting region E1, and is referred to as a vertical direction V.

The display panel 20 includes, for example, a top emission type organic EL device. As illustrated in FIGS. 5 and 6, the display panel 20 includes the light-emitting region E1 and a non-light-emitting region E2. The light-emitting region E1 is a region in which emission/non-emission of an organic EL layer in each of the plurality of pixels is controlled to generate an image. The light-emitting region E1 is a rectangular region in which a plurality of pixels are arranged to form a matrix. A light-emitting layer 293 described below is covered by a sealing film 257 and a protective substrate 255.

The non-light-emitting region E2 is a rectangular frame-shaped region surrounding the light-emitting region E1. In other words, the non-light-emitting region E2 is a region from the outer edge of the light-emitting region E1 to an outer edge 20a of the display panel 20. The outer edge 20a of the display panel 20 is an outer edge of a substrate 250 described below. In the embodiment, the non-light-emitting region E2 corresponds to the frame region of the display panel 20. The non-light-emitting region E2 includes a mounting region E3.

A plurality of mounting terminals 19 are provided in the mounting region E3. Control signals and power supply potential are supplied to the mounting terminals 19 from various external circuits (not illustrated) such as a control circuit and a power supply circuit. The external circuits are mounted on a flexible wiring substrate (not illustrated) bonded to the mounting region E3, for example.

As illustrated in FIG. 5, the first display panel 21 includes the plurality of first pixels 26 each having a first light-emitting element. The first display panel 21 is configured to emit, from each of the plurality of first pixels 26, the first colored light of the first wavelength region. In the embodiment, the first colored light is green light, and the first pixel 26 emits light of the green wavelength region (first wavelength region) of, for example, 500 nm to 580 nm.

As illustrated in FIG. 6, the second display panel 22 includes a plurality of second pixels 27 each including a second light-emitting element, and a plurality of third pixels 28 each including a third light-emitting element. The second display panel 22 is configured to emit, from each of the plurality of second pixels 27, second colored light of a second wavelength region different from the first wavelength region, and emit, from each of the plurality of third pixels 28, third colored light of a third wavelength region different from the first wavelength region and the second wavelength region. In the embodiment, the second colored light is blue light, and the third colored light is red light. Thus, the second pixel 27 emits light of the blue wavelength region (second wavelength region) of 400 nm to 500 nm, for example, and the third pixel 28 emits light of the red wavelength region (third wavelength region) of 580 nm to 780 nm, for example.

In the embodiment, each of the first pixels 26, the second pixels 27, and the third pixels 28 has a substantially square shape, and has the same dimensions in the horizontal direction H and the vertical direction V. Thus, the areas of the first pixels 26, the second pixels 27, and the third pixels 28 are the same.

As illustrated in FIG. 6, in the second display panel 22, the order of pixels in the uppermost row is as follows, from left to right: the third pixel 28, the second pixel 27, the third pixel 28, the second pixel 27 . . . . The order of pixels in the second row from the top is as follows, from left to right: the second pixel 27, the third pixel 28, the second pixel 27, the third pixel 28 . . . . This arrangement pattern is repeated in the remaining rows. In other words, the plurality of second pixels 27 and the plurality of third pixels 28 are alternately arranged in the horizontal direction H and the vertical direction V of the second display panel 22.

Figure 7:
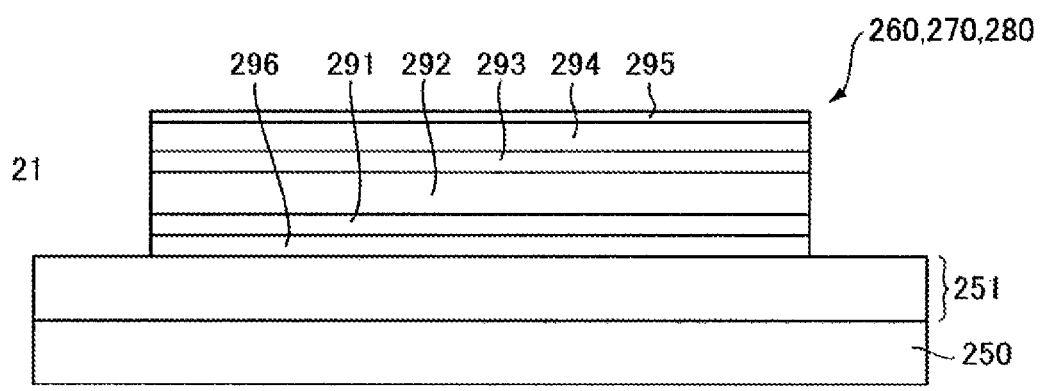
FIG. 7 is a cross-sectional view of a light-emitting element included in each of the display panels.

FIG. 7 is a cross-sectional view of a light-emitting element included in each of the display panels 20. The first light-emitting element 260, the second light-emitting element 270, and the third light-emitting element 280 have the same basic configuration, but have different materials of an organic functional layer including an organic EL layer.

As illustrated in FIG. 7, all of the first light-emitting element 260, the second light-emitting element 270, and the third light-emitting element 280 are organic electroluminescent elements. Thus, in both the first display panel 21 and the second display panel 22, several layers of insulating films 251 are formed on one surface of the substrate 250, and various wiring and driving elements are formed between the layers of the insulating films 251. In addition, the first light-emitting element 260, the second light-emitting element 270, and the third light-emitting element 280 are formed on a surface of the insulating film 251 opposite to the surface facing the substrate 250. In the embodiment, each of the first light-emitting element 260, the second light-emitting element 270, and the third light-emitting element 280 has a structure in which a reflection layer 296, a first electrode 291 serving as a pixel electrode (anode), a hole transport layer 292, a light-emitting layer 293, an electron transport layer 294, a second electrode 295 serving as a common electrode (cathode), and the like are stacked. A hole injection layer may also be formed between the first electrode 291 and the hole transport layer 292.

In the embodiment, each of the first light-emitting element 260 (first pixel 26), the second light-emitting element 270 (second pixel 27), and the third light-emitting element 280 (third pixel 28) emits fluorescence light or phosphorescence light. In other words, the first light-emitting element 260, the second light-emitting element 270, and the third light-emitting element 280 emit fluorescence light, when the light emission occurs due to a singlet exciton resulting from an excited state by a recombination of an electron and hole.

Further, when the light emission occurs due to a triplet exciton resulting from an excited state by a recombination of an electron and hole or by a triplet exciton formed by intersystem crossing from a singlet state, phosphorescence light is emitted.

Any one or a combination of various p-type polymeric materials and various p-type low molecular materials can be used for the hole transport layer 292. For example, for the hole transport layer 292, tetraarylbenzidine derivatives such as N,N'-di(1-naphthyl)-N,N'-diphenyl-1,1'-diphenyl-4,4'-diamine (NPD) and N,N'-diphenyl-N,N'-bis(3-methylphenyl)-1,1'-diphenyl-4,4'-diamine (TPD), tetraaryldiaminofluorene compounds or derivatives thereof (amine compounds), or the like may be used.

For the electron transport layer 294, phenanthroline derivatives such as 2,9-dimethyl-4,7-diphenyl-1,10-phenanthroline (BCP), quinoline derivatives such as organometallic complexes with 8-quinolinol or derivatives thereof as ligands (for example, tris(8-quinolinolato)aluminium (Alq3)), azaindolizine derivatives, oxadiazole derivatives, perylene derivatives, pyridine derivatives, pyrimidine derivatives, quinoxaline derivatives, diphenylquinone derivatives, nitro-substituted fluorene derivatives, or the like may be used.

For the hole injection layer, copper phthalocyanine, 4,4', 4"-tris(N,N-phenyl-3-methylphenylamino)triphenylamine (m-MTDATA), N,N'-bis-(4-diphenylamino-phenyl)-N,N'-diphenyl-biphenyl-4-4'-diamine, or the like may be used.

For a host in the light-emitting layer 293, anthracene derivatives, naphthacene derivatives, perylene derivatives, distyrylbenzene derivatives, distyrylamine derivatives, quinolinolato metal complexes such as tris(8-quinolinolato) aluminium complex (Alq3), triarylamine derivatives, oxadiazole derivatives, silole derivatives, dicarbazole derivatives, oligothiophene derivatives, benzopyran derivatives, triazole derivatives, benzoxazole derivatives, benzothiazole derivatives, or the like may be used.

As a dopant for red light in the light-emitting layer 293, perylene derivatives such as tetraaryldiindenoperylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizine-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), or the like may be used. Further, materials for red phosphorescence is not especially limited and may include any materials that emit red phosphorescence light, such as complexes of metals such as iridium, ruthenium, platinum, osmium, rhenium, and palladium, for example. The metals complexes may have at least one ligand having a phenylpyridine backbone, bipyridyl backbone, porphyrin backbone, or the like.

As a dopant for blue light, distyrylamine derivatives such as distyryldiamine compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl(BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], poly[(9,9-dioctylfluorene-2,7-diyl)-co-(ethylnylbenzene)], or the like may be used. Further, materials for blue phosphorescence light is not especially limited and may include any materials that emit blue phosphorescence light, such as complexes of metals such as iridium, ruthenium, platinum, osmium, rhenium, and palladium, for example.

As a dopant for green light, quinacridones and derivatives thereof such as quinacridone derivatives, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorenylene)-alt-co-(2-methoxy-5-(2-ethoxylhexyloxy)-1,4-phenylene)], or the like may be used. Further, materials for green phosphorescence light is not especially limited and may include any materials that emit green phosphorescence light, such as complexes of metals such as iridium, ruthenium, platinum, osmium, rhenium, and palladium, for example. Among those, the metal complexes having at least one ligand having a phenylpyridine backbone, bipyridyl backbone, porphyrin backbone, or the like are preferable.

In the embodiment, structures of the first light-emitting element 260, the second light-emitting element 270, and the third light-emitting element 280 are as follows, for example.

First light-emitting element 260:
Hole transport layer 292=40 nm
Light-emitting layer 293=host material (15 nm) including 10% by mass of dopant for green light
Electron Transport Layer 294=25 nm Second light-emitting element 270:
Hole transport layer 292=40 nm
Light-emitting layer 293=host material (15 nm) including 8% by mass of dopant for blue light
Electron Transport Layer 294=25 nm Third light-emitting element 280:
Hole transport layer 292=40 nm
Light-emitting layer 293=host material (15 nm) including 1.5% by mass of dopant for red light
Electron Transport Layer 294=25 nm In the embodiment, when the organic EL element is configured as a top emission type element including an optical resonator, the reflective layer 296 made of aluminum or the like is formed on the substrate 250 side with respect to the first electrode 291, and the second electrode 295 is formed by a half mirror layer formed of a magnesium-silver alloy and having a thickness of 10 nm. Although the respective layers in the first light-emitting element 260, the second light-emitting element 270, or the third light-emitting element 280 illustrated in FIG. 7 have the same thickness, the thickness of the first electrode 291, the light-emitting layer 293, or the like is adjusted to adjust the optical length between the second electrode 295 and the reflective layer 296. In the embodiment, the wavelength regions have the following relationship.

Wavelength region of second colored light L2B<wavelength region of first colored light L1G<wavelength region of third colored light L3R Therefore, the thicknesses of the first electrode 291, the light-emitting layer 293, or the like have the following relationship.

Second light-emitting element 270<first light-emitting element 260<third light-emitting element 280

As described above, the first colored light L1G, the second colored light L2B, and the third colored light L3R are synthesized by the dichroic prism 61 to form a synthesized image G1 including the first colored light L1G, the second colored light L2B, and the third colored light L3R.

Figure 8:
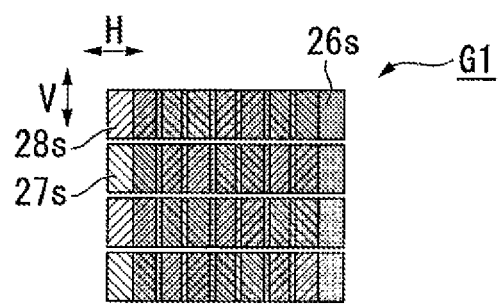
FIG. 8 is a diagram illustrating a superimposed state of pixels in a synthesized image.

FIG. 8 is a diagram illustrating a superimposed state of pixels in a synthesized image.

As illustrated in FIG. 8, in the synthesized image G1, the positions of images 26s by the plurality of first pixels are shifted from the positions of images 27s by the plurality of second pixels and images 28s by the plurality of third pixels. Specifically, the positions of the images 26s by the plurality of first pixels are shifted, by the half of the horizontal pitch of the pixels and in the horizontal direction H of the synthesized image G1, from the positions of the images 27s by the plurality of second pixels and the images 28s by the plurality of third pixels. Note that the horizontal pitch of the pixels is the distance between the centers of two horizontally adjacent pixels.

In order to achieve the configuration described above, the first display panel 21 and the second display panel 22 are positioned with respect to the dichroic prism 61 such that, during the synthesized image G1 being formed, the positions of the images 26s by the plurality of first pixels are shifted, by the half of the horizontal pitch of the pixels and in the horizontal direction H, from the positions of the images 27s by the plurality of second pixels and the images 28s by the plurality of third pixels.

Basic Operation

As illustrated in FIG. 3, the synthesized light Lb that is parallel light entering from the incidence part 40, is refracted by the incident surface 41 upon the entering and travels toward the reflection surface 42. Next, the synthesized light Lb is reflected on the reflection surface 42, and then, travels toward the incident surface 41 again. At this time, since the synthesized light Lb is incident on the incident surface 41 at an incident angle equal to or greater than the critical angle, the synthesized light Lb is reflected on the incident surface 41 and travels toward the light-guiding part 50.

In the embodiment, in the incidence part 40, the configuration is used in which the synthesized light Lb that is the parallel light is incident on the incident surface 41. However, a configuration may be adopted in which the incident surface 41 and the reflection surface 42 are a free form surface or the like, and after the synthesized light Lb, which is non-parallel light, is incident on the incident surface 41, the synthesized light Lb is reflected by the reflection surface 42 and the incident surface 41 and is converted to parallel light while being reflected. In this case, the projection optical system 70 can be omitted.

In the light-guiding part 50, the synthesized light Lb is reflected by the first surface 56 and the second surface 57 so as to travel from the one side X1 to the other side X2 in the first direction X. Then, a part of the synthesized light Lb incident on the partial reflection surface 55 is reflected on the partial reflection surface 55 and is emitted from the emitting part 58 toward an eye E of an observer. Further, the rest of the synthesized light Lb incident on the partial reflection surface 55 passes through the partial reflection surface 55 and is incident on the next partial reflection surface 55 located at an adjacent position on other side X2 in the first direction X. Thus, each of the plurality of partial reflection surfaces 55 reflects the synthesized light Lb toward the one side Z1 in the second direction Z, and the reflected light is emitted from the emitting part 58 toward the eye E of the observer.

As a result, the observer can recognize a color image formed by synthesizing the first colored light L1G emitted from the first display panel 21 and the second colored light L2B and the third colored light L3R emitted from the second display panel 22. In the image recognized by the observer using the image display device 100, the horizontal direction H is a direction along the first direction X, and the vertical direction V is a direction along the third direction Y. Further, as for the light entering the light-guiding part 50 from the outside, this light passes through the partial reflection surfaces 55 after entering the light-guiding part 50, and reaches the eye E of the observer. Thus, the observer can visually recognize the external environment in a see-through manner.

In the image display module 150 according to the embodiment, the synthesis optical system 60 includes the dichroic prism 61 including the single dichroic mirror 611. Thus, unlike known image display modules with a cross dichroic prism including two dichroic mirrors intersecting each other at the center of the cross dichroic prism, the image display module 150 according to the embodiment can provide an image that does not contain a linear defect at the center of the image, and thus achieve higher image quality than ever.

Further, in the embodiment, the first display panel 21 configured to emit green light and the second display panel 22 configured to emit blue light and red light are provided, and a color image is generated by using regions in pixels in which green light and blue light are superimposed, and regions in pixels in which green light and red light are superimposed. The human eye is more sensitive to green light than the other primary colors. Therefore, the image display module 150 according to the embodiment can provide a bright image in terms of sensitivity of the eye of the user.

In addition, in the embodiment, the required number of the display panels 20 is two, and thus, the image display module 150 can be assembled efficiently. In addition, both of the first display panel 21 and the second display panel 22 are display panels including organic EL elements, and thus, unlike the liquid crystal panel, do not require any illuminating devices such as a backlight. As a result, it is possible to reduce the size and weight of the image display device 100 including the image display module 150, and cost reduction can be achieved.

Here, an image display module of a comparative example 1 is assumed, in which the pixels are in an entirely superimposed state and the positions of the images by the plurality of first pixels are not shifted from the positions of the images by the plurality of second pixels and plurality of third pixels. In the image display module according to the comparative example, for example, when a certain line that is a sequence of pixels is lit up, pixels in which green light and red light are synthesized and pixels in which green light and blue light are synthesized are alternately arranged in the line. In this case, the display of the line is formed by yellow pixels and cyan pixels alternately arranged in the length direction of the line. Thus, the display may cause an uncomfortable feeling.

On the other hand, in the image display module 150 according to the embodiment, as illustrated in FIG. 8, the positions of the images 26s by the plurality of first pixels are shifted, by the half of the pitch and in the horizontal direction H, from the positions of the images 27s by the plurality of second pixels and the images 28s by the plurality of third pixels. Therefore, the image 26s by a single first pixel is superimposed with both of the image 27s by a second pixel and the image 28s by a third pixel, which are adjacent to each other. In other words, one half of the region of the image 26s by a first green pixel is superimposed with the image 27s by a second blue pixel, and the other half of the region of the image 26s by the first green pixel is superimposed with the image 28s by a third red pixel.

Therefore, when a certain line is lit up, in the width direction of the line, an yellow region and a cyan region, each of which has an area being equal to one-half the area of a pixel, are arranged adjacent to each other, and this pattern is repeated in the length direction of the line while the arrangement order of the yellow region and the cyan region is alternately reversed, as a result of which a display of the line is formed. In other words, in the image display module 150 according to the embodiment, a single line of display includes a fine interdigitated pattern of the yellow regions and the cyan regions, as compared to the image display module according to the comparative example. As a result, the image display module 150 according to the embodiment can reduce the uncomfortable feeling resulting from displaying of a certain image, in comparison with the image display module according to the comparative example.

The image display module 150 according to the embodiment may have the following configuration.

With the following configuration, it is also possible to achieve similar effects to that of the first embodiment, i.e., reduction of uncomfortable feeling resulting from displaying of a certain image.

FIRST MODIFIED EXAMPLE

Figure 9:
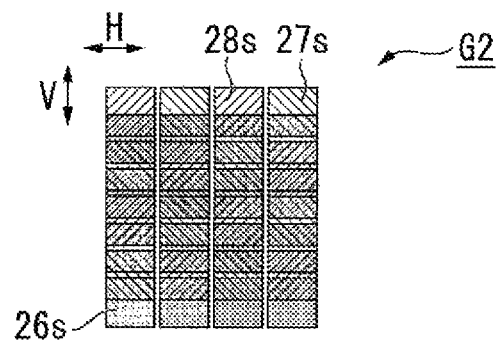
FIG. 9 is a diagram illustrating a superimposed state of pixels in a synthesized image according to a first modified example.

FIG. 9 is a diagram illustrating a superimposed state of the first pixels, the second pixels, and the third pixels in a synthesized image G2 according to a first modified example.

As illustrated in FIG. 9, in the image display module according to the first modified example, the positions of images 26s by the plurality of first pixels are shifted, by the half of the vertical pitch of the pixels and in the vertical direction V of the synthesized image G2, from the positions of images 27s by the plurality of second pixels and images 28s by the plurality of third pixels. Note that the vertical pitch of the pixels is the distance between the centers of two vertically adjacent pixels.

SECOND MODIFIED EXAMPLE

Figure 10:
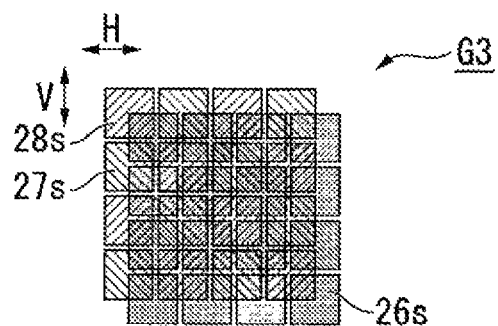
FIG. 10 is a diagram illustrating a superimposed state of pixels in a synthesized image according to a second modified example.

FIG. 10 is a diagram illustrating a superimposed state of the first pixels, the second pixels, and the third pixels in a synthesized image G3 according to a second modified example.

As illustrated in FIG. 10, in the image display module according to the second modified example, the positions of images 26s by the plurality of first pixels are shifted, by the half of an oblique pitch of the pixels and in an oblique direction of the synthesized image G3, from the positions of images 27s by the plurality of second pixels and images 28s by the plurality of third pixels. Note that the oblique pitch of the pixels is the distance between the centers of two pixels adjacent to each other in an oblique direction (diagonal direction) of the pixels.

Second Embodiment

Second Embodiment of the present disclosure will be described below with reference to FIGS. 11 and 12.

A image display module and an image display device in Second Embodiment are the same as those of First Embodiment, and the configuration of the second display panel is different from that of First Embodiment. Therefore, the overall configuration of the image display module and the image display device will not be described.

Figure 11:
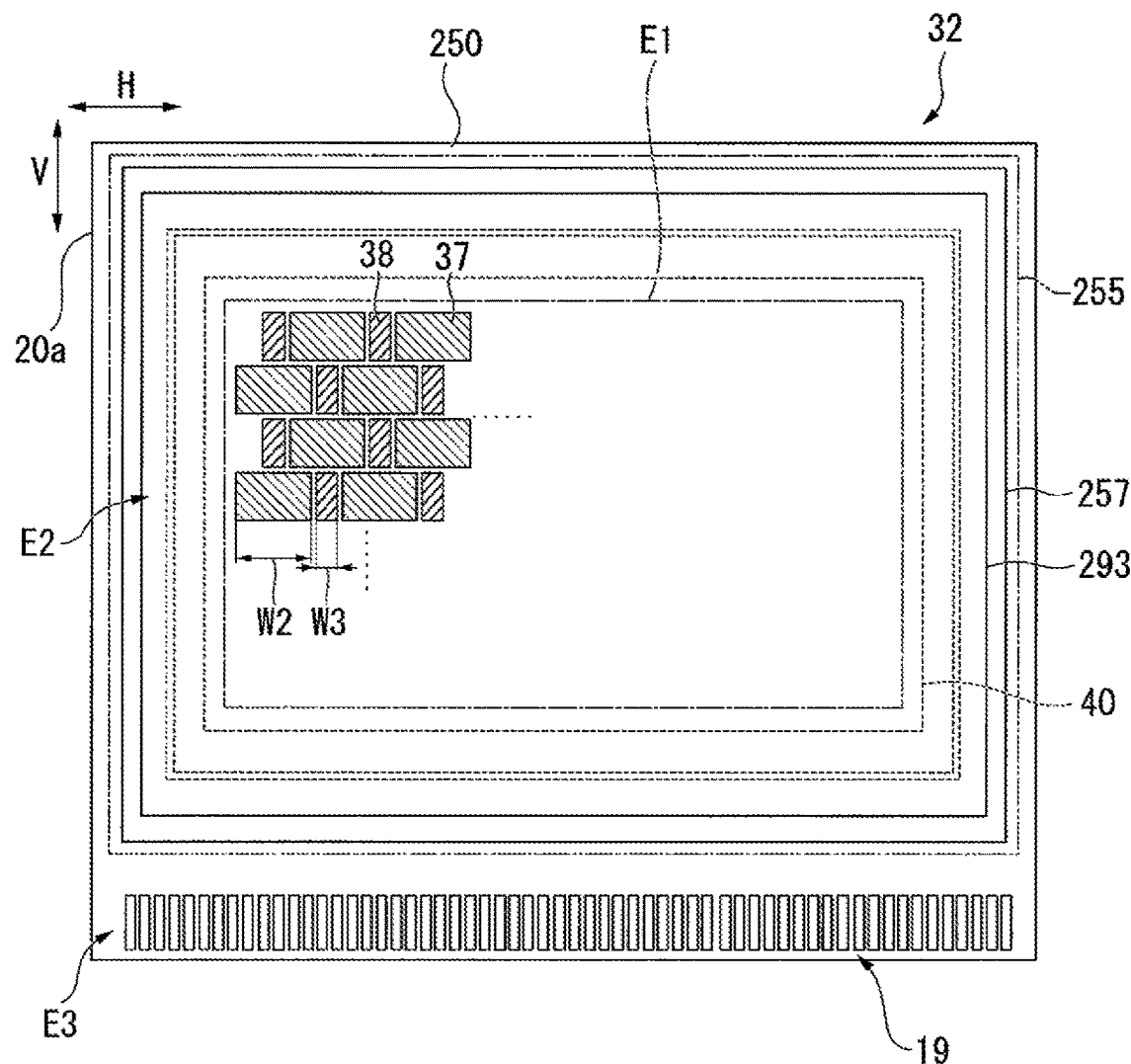
FIG. 11 is a front view of a second display panel in Second Embodiment.

FIG. 11 is a front view of the second display panel in Second Embodiment. FIG. 12 is a diagram illustrating a superimposed state of pixels in a synthesized image.

Figure 12:
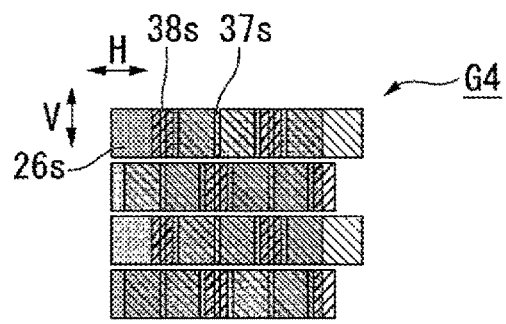
FIG. 12 is a diagram illustrating a superimposed state of pixels in a synthesized image.

In FIGS. 11 and 12, the components common to those illustrated in FIGS. 6 and 8 relating to First Embodiment are denoted with the same reference numerals, and the description thereof will not be repeated.

In the image display module according to Second Embodiment, the configuration of the first display panel is the same as the configuration of the first display panel 21 of First Embodiment illustrated in FIG. 5. In other words, each of the plurality of first pixels 26 has a substantially square shape, and has the same dimensions in the horizontal direction H and in the vertical direction V.

In Second Embodiment, as illustrated in FIG. 11, second pixels 37 and third pixels 38 in the second display panel 32 have a substantially rectangular shape. The dimensions in the vertical direction V of the second pixel 37 and the third pixel 38 are equal to the dimension in the vertical direction V of the first pixel 26. The dimension in the horizontal direction H of the second pixel 37 and the dimension in the horizontal direction H of the third pixel 38 are different from each other, and also different from the dimension in the horizontal direction H of the first pixel 26.

The dimension in the horizontal direction H of the second pixel 37 is longer than the dimension in the horizontal direction H of the first pixel 26, and the dimension in the horizontal direction H of the third pixel 38 is shorter than the dimension in the horizontal direction H of the first pixel 26. In other words, the relationship among the dimensions in the horizontal direction H of the pixels 26, 37, and 38 can be expressed as W3<W1<W2, where W1 represents the dimension in the horizontal direction H of the first pixel 26 (see FIG. 5), W2 represents the dimension in the horizontal direction H of the second pixel 37, and W3 represents the dimension in the horizontal direction H of the third pixel 38. Thus, in the second display panel 32, the area of the second pixel 37 is larger than the area of the third pixel 38. The sum of the dimension W2 in the horizontal direction H of the second pixel 37 and the dimension W3 in the horizontal direction H of the third pixel 38 is substantially equal to the double of the dimension W1 in the horizontal direction H of the first pixel 26.

In the second display panel 32, the order of pixels in the uppermost row is as follows, from left to right: the third pixel 38, the second pixel 37, the third pixel 38, the second pixel 37 . . . . The order of pixels in the second row from the top is as follows, from left to right: the second pixel 37, the third pixel 38, the second pixel 37, the third pixel 38 . . . . This arrangement pattern is repeated in the remaining rows. In other words, the plurality of second pixels 37 and the plurality of third pixels 38 are alternately arranged in the horizontal direction H and in the vertical direction V of the second display panel 32.

Other configurations of the image display module is the same as those of First Embodiment.

As illustrated in FIG. 12, in the synthesized image G4, the positions of images 26s by the plurality of first pixels are shifted from the positions of images 37s by the plurality of second pixels and images 38s by the plurality of third pixels. Specifically, each of the images 37s by the second pixels and the images 38s by the third pixels is superimposed with two images 26s by two first pixels adjacent to each other.

The Second Embodiment can also achieve similar effects to those of First Embodiment, including a high-quality and bright image, reduction of uncomfortable feeling resulting from displaying of a certain image, and a small size, light weight, and low cost image display device.

The image display module according to Second Embodiment can further achieve the following effects.

As exemplified in First Embodiment, the constituent material of the light-emitting layer 293 differs depending on color of light. In general, light-emitting layer materials for blue light tend to have a shorter lifespan than light-emitting layer materials for green light and light-emitting layer materials for red light. Therefore, when driving current is supplied at the same current density to these light-emitting layer materials, problematically, the light emission efficiency of the light-emitting layer material for blue light deteriorates faster as compared to the light-emitting layer material for green light or red light.

From the view point of the above, in the second display panel 32 of Second Embodiment, the area of the second pixel 37, in which the light-emitting layer material for the blue light having a relatively short lifespan is used, is larger than the area of the third pixel 38, in which the light-emitting layer material for the red light having a relatively long lifespan is used. Thus, even when the same amount of drive current is supplied to the second pixel 37 and the third pixel 38, the current density per unit area in the second pixel 37 is smaller than the current density per unit area in the third pixel 38. As a result, the lifespan of the light-emitting layer material of the second pixel 37 can be extended, and the long life of the image display module can be ensured without compromising display quality. Note that the ratio between the area of the second pixel 37 and the area of the third pixel 38 may be determined appropriately based on the lifespan of the light-emitting layer material.

Note that the technical scope of the present disclosure is not limited to the above-described embodiments, and various modifications can be made to the above-described embodiments without departing from the spirit and gist of the present disclosure.

For example, it may be possible to change, as appropriate, the material, number, arrangement, shape, or other specific configurations of each constituent element of the image display module and the image display device given as examples in the embodiments described above.

In addition, although, in the above-described embodiment, the configuration obtained by combining the organic EL panel and the dichroic prism is given as an example of the image display module, the image display panel is not limited to the organic EL panel, and it may be possible to use an inorganic EL panel, micro LED panel or other self-light-emission panel.

An example of the image display device including the image display module described in the above embodiments includes an electronic view finder (EVF) or the like used in an imaging device such as a projector, a video camera, and a still camera.

What is claimed is:

1. An image display module, comprising:
   a first display panel including a plurality of first pixels each including a first light-emitting element, the first display panel being configured to emit green light from each of the plurality of first pixels;
   a second display panel including a plurality of second pixels each including a second light-emitting element and a plurality of third pixels each including a third light-emitting element, the second display panel being configured to emit blue light from each of the plurality of second pixels, and emit red light from each of the plurality of third pixels; and
   a synthesis optical system including a dichroic prism, the dichroic prism including a dichroic mirror and being configured to synthesize the green light, the blue light, and the red light, the dichroic mirror being configured to transmit or reflect the green light and reflect or transmit the blue light and the red light,
   wherein in the second display panel, an area of the second pixel is larger than an area of the third pixel.

2. An image display device comprising the image display module according to claim 1.

3. The image display module according to claim 1, wherein in a synthesized image including the green light, the blue light, and the red light, positions of images by the plurality of first pixels are shifted from positions of images by the plurality of second pixels and the plurality of third pixels.

4. The image display module according to claim 3, wherein the positions of images by the plurality of first pixels are shifted from the positions of images by the plurality of second pixels and the plurality of third pixels, in a horizontal direction of the synthesized image.

5. The image display module according to claim 3, wherein the positions of images by the plurality of first pixels are shifted from the positions of images by the plurality of second pixels and the plurality of third pixels, in a vertical direction of the synthesized image.

6. The image display module according to claim 3, wherein the positions of images by the plurality of first pixels are shifted from the positions of images by the plurality of second pixels and the plurality of third pixels, in an oblique direction of the synthesized image.

7. An image display module, comprising:
   a first display panel including a plurality of first pixels each including a first light-emitting element, the first display panel being configured to emit, from each of the plurality of first pixels, first colored light of a first wavelength region;
   a second display panel including a plurality of second pixels each including a second light-emitting element and a plurality of third pixels each including a third light-emitting element, the second display panel being configured to emit, from each of the plurality of second pixels, second colored light of a second wavelength region, which is different from the first wavelength region, and emit, from each of the plurality of third pixels, third colored light of a third wavelength region, which is different from the first wavelength region and the second wavelength region; and
   a synthesis optical system including a dichroic prism, the dichroic prism including a dichroic mirror and being configured to synthesize the first colored light, the second colored light, and the third colored light, the dichroic mirror being configured to transmit or reflect the first colored light and reflect or transmit the second colored light and the third colored light, wherein
   dimensions of the plurality of first pixels, the plurality of second pixels, and the plurality of third pixels are identical to one another, and
   each of the plurality of second pixels and each of the plurality of third pixels are alternately arranged in a horizontal direction and in a vertical direction of the second display panel.

8. The image display module according to claim 7, wherein in a synthesized image including the first colored light, the second colored light, and the third colored light, positions of images by the plurality of first pixels are shifted from positions of images by the plurality of second pixels and the plurality of third pixels.

9. The image display module according to claim 8, wherein the positions of images by the plurality of first pixels are shifted from the positions of images by the plurality of second pixels and the plurality of third pixels, in a horizontal direction of the synthesized image.

10. The image display module according to claim 8, wherein the positions of images by the plurality of first pixels are shifted from the positions of images by the plurality of second pixels and the plurality of third pixels, in a vertical direction of the synthesized image.

11. The image display module according to claim 8, wherein the positions of images by the plurality of first pixels are shifted from the positions of images by the plurality of second pixels and the plurality of third pixels, in an oblique direction of the synthesized image.

12. An image display device comprising the image display module according to claim 7.

* * * * *